United States Patent
Hokabira et al.

(10) Patent No.: US 8,618,845 B2
(45) Date of Patent: Dec. 31, 2013

(54) SWITCHING DEVICE CONTROL CIRCUIT

(75) Inventors: Ryuji Hokabira, Ora-gun (JP); Takekiyo Okumura, Ota (JP)

(73) Assignee: ON Semiconductor Trading, Ltd., Hamilton (BM)

( * ) Notice: Subject to any disclaimer, the term of this patent is extended or adjusted under 35 U.S.C. 154(b) by 86 days.

(21) Appl. No.: 13/219,013

(22) Filed: Aug. 26, 2011

(65) Prior Publication Data

US 2012/0049932 A1    Mar. 1, 2012

(30) Foreign Application Priority Data

Aug. 27, 2010   (JP) ................ 2010-190889

(51) Int. Cl.
*H03K 3/00*   (2006.01)

(52) U.S. Cl.
USPC .......................... 327/109; 327/108

(58) Field of Classification Search
USPC ................................. 327/108, 109
See application file for complete search history.

(56) References Cited

U.S. PATENT DOCUMENTS

| | | | | |
|---|---|---|---|---|
| 5,664,550 A | * | 9/1997 | Ito et al. ................ | 123/630 |
| 7,095,182 B2 | * | 8/2006 | Ando et al. ............. | 315/209 T |
| 7,341,052 B2 | * | 3/2008 | Kawakita ................ | 123/647 |
| 2004/0011342 A1 | * | 1/2004 | Fukatsu ................. | 123/630 |
| 2005/0046463 A1 | * | 3/2005 | Throngnumchai et al. ... | 327/524 |
| 2005/0146822 A1 | * | 7/2005 | Ando et al. ............. | 361/93.8 |
| 2006/0244496 A1 | * | 11/2006 | Kawakita ................ | 327/110 |
| 2007/0221994 A1 | * | 9/2007 | Ishikawa et al. ......... | 257/356 |

FOREIGN PATENT DOCUMENTS

JP   2003-108241   4/2003

\* cited by examiner

*Primary Examiner* — Ryan Jager
(74) *Attorney, Agent, or Firm* — Morrison & Foerster LLP (57) ABSTRACT

There is offered a switching device control circuit that can accurately estimate a temperature of a power device to execute thermal shutdown without increasing the number of terminals. The control circuit has an output unit controlling an operating current flowing through an IGBT based on an input signal, a temperature detection unit outputting a detection signal when a temperature of the control circuit rises above a second preset temperature that is set corresponding to a first preset temperature of the IGBT after the IGBT commences its operation, and an output control unit controlling the output unit so as to turn off the IGBT in response to the detection signal.

7 Claims, 12 Drawing Sheets

SWITCHING DEVICE CONTROL CIRCUIT

CROSS-REFERENCE OF THE INVENTION

This application claims priority from Japanese Patent Application No. 2010-190889, the content of which is incorporated herein by reference in its entirety.

BACKGROUND OF THE INVENTION

1. Field of the Invention

This invention relates to a switching device control circuit, specifically to a switching device control circuit having a thermal shutdown function.

2. Description of the Related Art

There has been known a semiconductor IC (Integrated Circuit) having the thermal shutdown function, which halts circuit operation when it reaches or exceeds a predetermined high temperature so that internal devices are protected from destruction or deterioration due to the high temperature (Refer to Japanese Patent Application Publication No. 2003-108241, for example.).

In this kind of IC, there are cases where the device to be protected and its control circuit are formed in separate ICs. That is, an IC 100 that includes a power device (a switching device driving a large operating current) and its control IC 200 are formed in separate IC chips, as in a structure shown in FIG. 14. The control IC 200 exchanges signals with the IC 100 that includes the power device so as to control a current flowing through the power device. In this case, a temperature detection unit 101 is incorporated in the IC 100 that includes the power device.

Figure 14:
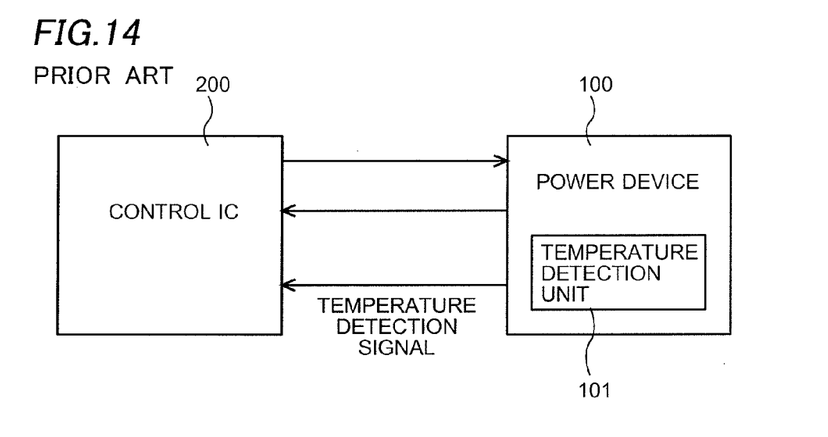
FIG. 14 shows a structure of a conventional thermal shutdown circuit.

The control IC 200 is configured to halt the operation of the power device to protect it when the control IC 200 receives a temperature detection signal from the temperature detection unit 101 and judges that a temperature of the power device has reached or exceeded a predetermined high temperature.

Figure 15:
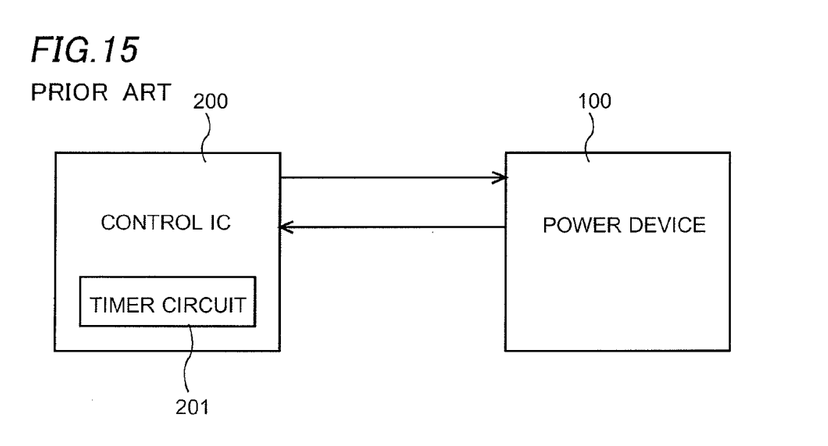
FIG. 15 shows a structure of a conventional thermal shutdown circuit.

While the temperature detection unit 101 is incorporated in the IC 100 that includes the power device in the structure shown in FIG. 14, a timer circuit 201 is incorporated in the control IC 200 in an example structure shown in FIG. 15. The timer circuit 201 measures duration of time during which the power device is placed in operation. The control IC 200 estimates the temperature of the power device in response to the time measured by the timer 201, and controls so as to halt the operation of the power device when it judges that the temperature of the power device has reached or exceeded the predetermined high temperature.

However, in the case where the thermal shutdown is executed at the receipt of the temperature detection signal from the temperature detection unit 101 as in the structure shown in FIG. 14, there is a possibility that the control IC malfunctions (mistakenly executes the thermal shutdown, for example) because of a noise in the temperature detection signal. Also, there is a problem that the number of terminals increases since the temperature detection unit 101 is incorporated in the IC 100 that includes the power device. That is, the IC 100 that includes the power device requires an output terminal for the temperature detection signal, while the control IC 200 requires an input terminal for the temperature detection signal.

In the case where the timer circuit 201 is incorporated in the control IC 200 as in the structure shown in FIG. 15, obtaining a good correlation between the temperature of the power device and the duration measured by the timer 201 is difficult. Therefore, it is difficult to estimate the temperature of the power device accurately to execute the thermal shutdown.

SUMMARY OF THE INVENTION

This invention provides a control circuit of a switching device including an output unit controlling an operating current flowing through the switching device based on an input signal, a temperature detection unit outputting a detection signal when a temperature of the control circuit reaches a second preset temperature defined corresponding to a first preset temperature of the switching device after the switching device is put into operation, and an output control unit controlling the output unit so as to turn off the switching device in response to the detection signal.

Also, this invention provides a control circuit of a switching device including an output unit controlling an operating current flowing through the switching device based on an input signal, a pre-operation temperature detection unit detecting a temperature of the control circuit before the switching device is put into operation, a temperature detection control unit outputting a first detection signal when the temperature of the control circuit rises above a second preset temperature defined corresponding to a first preset temperature of the switching device after the switching device is put into operation and being configured to be capable of modifying the second preset temperature in accordance with a result of detection performed by the pre-operation temperature detection unit, and an output control unit controlling the output unit so as to turn off the switching device in response to the first detection signal.

DETAILED DESCRIPTION OF THE INVENTION

First Embodiment

Figure 1:
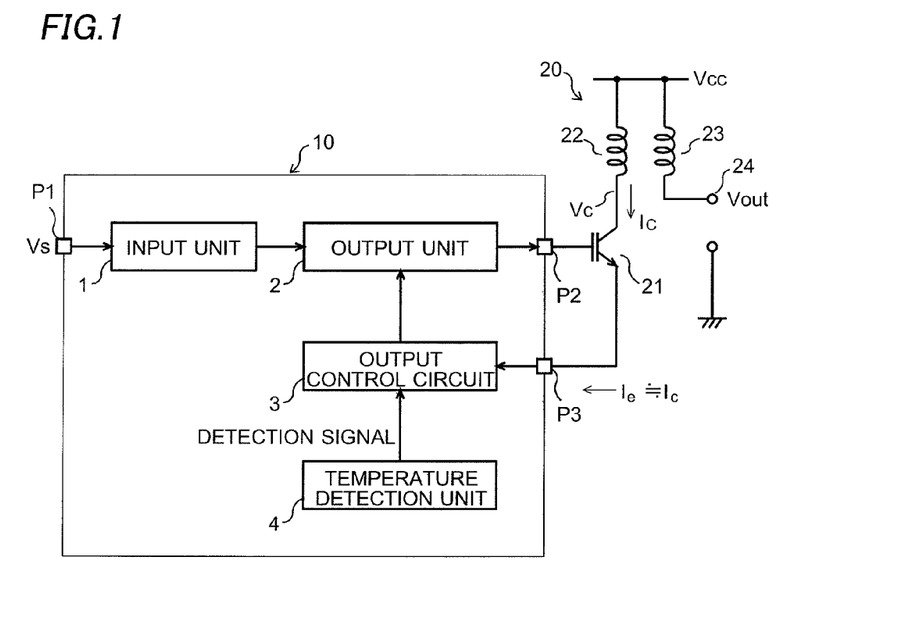
FIG. 1 is a circuit diagram showing an IGBT (Insulated Gate Bipolar Transistor) control circuit according to a first embodiment of this invention.

An IGBT (Insulated Gate Bipolar Transistor) control circuit according to a first embodiment of this invention is described referring to the drawings. FIG. 1 is a circuit diagram of the IGBT control circuit. The circuit shown in FIG. 1 as a whole makes an ignition device for an internal combustion engine, and includes an ignition coil circuit 20 (so-called ignitor circuit) to generate a high ignition voltage and a control circuit 10 to control operations of an IGBT 21 (an example of a switching device of this invention) in the ignition coil circuit 20.

The control circuit 10 is formed to be an IC including an input unit 1, an output unit 2, an output control unit 3 and a temperature detection unit 4. The ignition coil circuit 20 is provided outside the control circuit 10, and is formed to include the IGBT 21, a primary coil 22, a secondary coil 23 and an output terminal 24. The ignition coil circuit 20 may be formed in another IC or an IC module that is separate from the control circuit 10.

An ignition signal Vs is inputted to the input unit 1 through an input terminal P1 in the control circuit 10. The output unit 2 includes an output transistor, and generates a control voltage for controlling an operating current (collector current Ic) flowing through the IGBT 21 based on the ignition signal Vs and a control signal from the output control unit 3, and outputs it from the output transistor. The control voltage is applied to a gate of the IGBT 21 through an output terminal P2.

When the IGBT 21 is put into operation based on the control voltage from the output unit 2, a temperature of the IGBT 21 and a temperature of the control circuit 10 begin to rise simultaneously. The temperature detection unit 4 is configured to output a detection signal when the temperature of the control circuit 10 rises above a second preset temperature defined corresponding to a first preset temperature of the IGBT 21. The first preset temperature is determined based on a guaranteed operating temperature range of the IGBT 21. In this case, the temperature of the control circuit 10 which the temperature detection unit 4 detects when the temperature of the IGBT 21 rises to the first preset temperature is usually a lower temperature (target temperature) than the first preset temperature. The second preset temperature is set to be equal to, or close to the target temperature.

The output control unit 3 can execute the thermal shutdown when the temperature of the IGBT 21 rises to the first preset temperature, by controlling the output unit 2 so that the IGBT 21 is turned off to cut the collector current Ic of the IGBT 21 to zero in response to the detection signal outputted from the temperature detection unit 4.

In a normal operation, the output control unit 3 detects the operating current flowing through the IGBT 21 and executes a feedback control so as to keep the operating current constant. An emitter of the IGBT 21 is connected to the output control unit 3 through an input terminal P3 in the control circuit 10 for the feedback control. The output control unit 3 is provided with a current detection circuit to detect an emitter current Ie flowing through the emitter of the IGBT 21 and a shunt resistor to pass the emitter current Ie to a ground. The emitter current Ie of the IGBT 21 is nearly equal to the collector current Ic. The output control unit 3 controls the output unit 2 so as to keep the operating current flowing through the IGBT 21, that is, the collector current Ic constant based on a result of the detection by the current detection circuit.

In the ignition coil circuit 20, the primary coil 22 is connected between the collector of the IGBT 21 and a power supply line that supplies a power supply voltage Vcc. The secondary coil 23 is connected between the power supply line and the output terminal 24.

=Structure of the Temperature Detection Unit 4=

Figure 2:
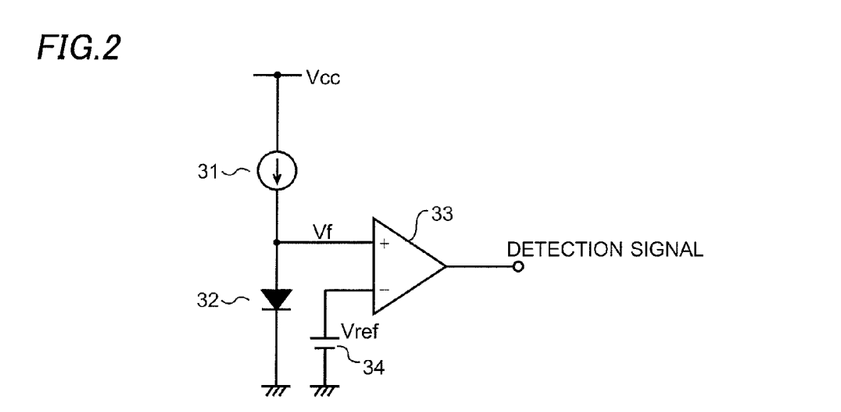
FIG. 2 is a circuit diagram showing a first example circuit of a temperature detection unit.

FIG. 2 is a circuit diagram showing a first example circuit of the temperature detection unit 4. The temperature detection unit 4 is structured to include a constant current source 31, a diode 32, a comparator 33 and a constant voltage source 34. The constant current source 31 and the diode 32 are connected in series between the power supply line that supplies the power supply voltage Vcc and the ground. A voltage Vf (forward voltage of the diode 32) at a connecting node between the constant current source 31 and the diode 32 is applied to a positive input terminal (+) of the comparator 33, while a reference voltage Vref that is from the constant voltage source 34 and has no temperature dependence is applied to a negative input terminal (−) of the comparator 33. Then, the detection signal is obtained as an output of the comparator 33.

That is, the output of the comparator 33 is at a high level when Vf>Vref, and is at a low level when Vf☐Vref. The higher an ambient temperature is, the more the voltage Vf is reduced because of temperature characteristics of the diode 32. Thus, the output of the comparator 33 turns from the high level to the low level when the voltage Vf becomes lower than the reference voltage Vref due to a rise in the temperature. Therefore, the temperature detection unit 4 can detect whether the temperature of the control circuit 10, in which the temperature detection unit 4 is incorporated, is higher than the second preset temperature or not by setting the reference voltage Vref to a voltage corresponding to the second preset temperature.

Figure 3:
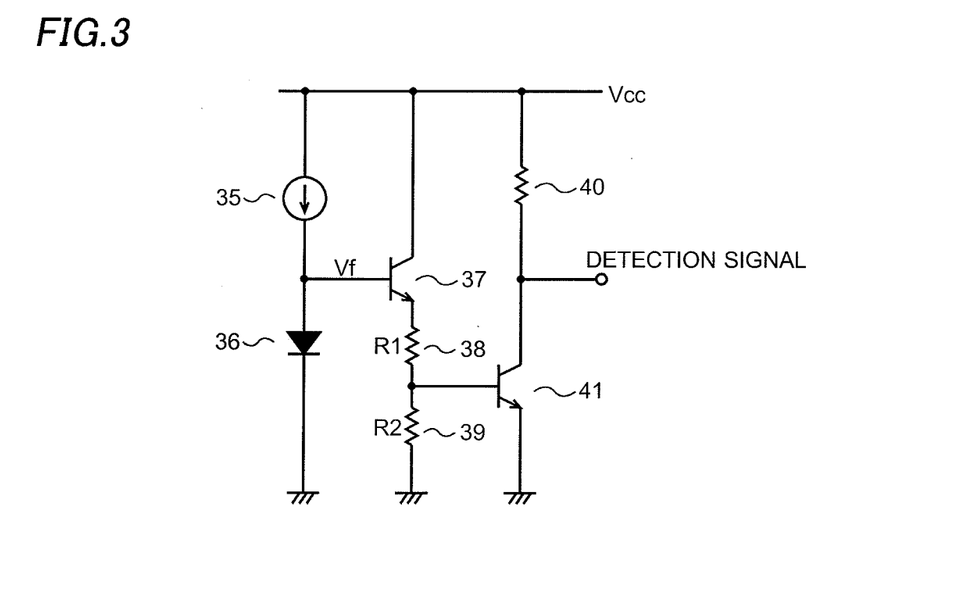
FIG. 3 is a circuit diagram showing a second example circuit of the temperature detection unit.

FIG. 3 is a circuit diagram showing a second example circuit of the temperature detection unit 4. The temperature detection unit 4 also uses the temperature characteristics of the diode, and is structured to include a constant current source 35, a diode 36, a first NPN type transistor 37, a first resistor 38, a second resistor 39, a third resistor 40 and a second NPN type transistor 41, so that the detection signal is obtained from a collector of the second NPN type transistor 41. With the temperature detection unit 4 in which the first resistor 38 and the second resistor 39 are connected in series between an emitter of the first NPN type transistor 37 and the ground, the second preset temperature can be adjusted by R2/R1, that is a ratio of a resistance R2 of the second resistor 39 to a resistance R1 of the first resistor 38.

=Normal Operations=

Normal operations of the control circuit 10 structured as described above are explained referring to FIG. 4. When the ignition signal Vs is inputted at a time t0, the IGBT 21 is turned on by the control voltage from the output unit 2. As a result, the collector current Ic flows through the IGBT 21. When the collector current Ic begins flowing through the IGBT 21, the collector voltage Vc is temporarily reduced, and electric energy is stored in the primary coil 22. The collector current Ic is controlled to keep a constant value (12 A, for example) by the feedback control of the output control unit 3. That is, the collector current Ic increases after the time t0, and remains at the constant value (12 A, for example) after a time is at which the feedback control of the output control unit 3 becomes effective.

Figure 4:
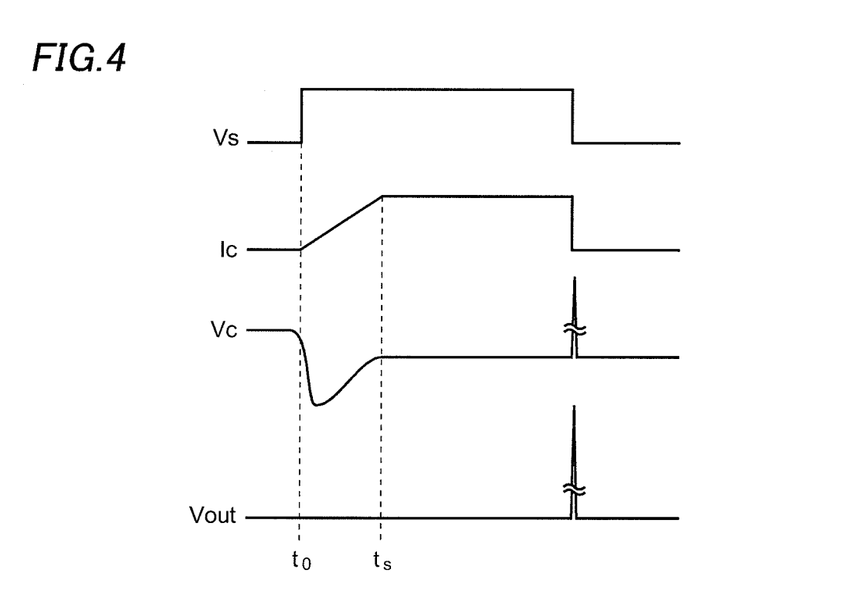
FIG. 4 is an operation waveform chart of the IGBT control circuit according to the first embodiment of this invention.

After that, when the ignition signal Vs turns from the high level to the low level, the IGBT 21 is turned off to cut the collector current Ic to zero in response to the control voltage from the output unit 2. Then, the collector voltage Vc at the collector of the IGBT 21 to which the primary coil 22 is connected is momentarily turned to a high voltage (400V, for example). Then, the high ignition voltage corresponding to a turns ratio between the primary coil 22 and the secondary coil 23 is generated at the output terminal 24. When the turns ratio between the primary coil 22 and the secondary coil 23 is 1:100, for example, an output voltage Vout from the secondary coil 23 is as high as 400V×100=40,000V.

=Thermal Shutdown Operation=

Figure 5:
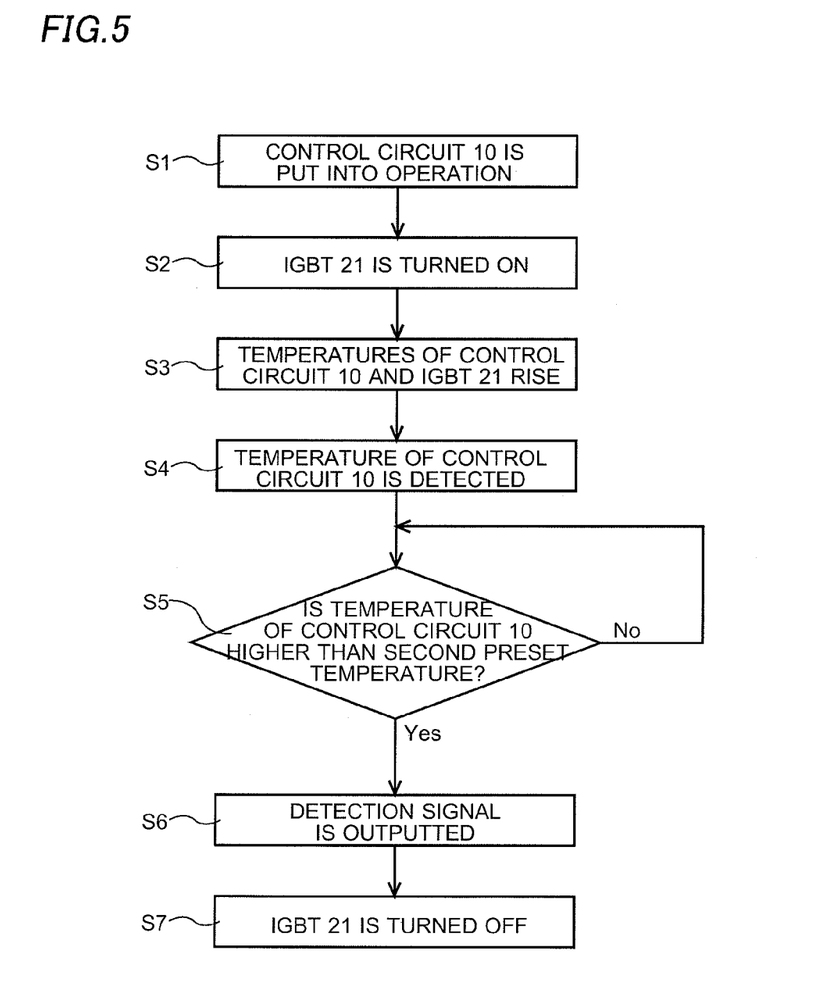
FIG. 5 is a flowchart showing operations of the IGBT control circuit according to the first embodiment of this invention.

Next, the thermal shutdown operation of the control circuit 10 structured as described above will be explained referring to a flowchart shown in FIG. 5. First, when the ignition signal Vs is inputted to the input terminal P1 in the control circuit 10, the control circuit 10 is turned to an ON state (enable state) and is put into operation (step S1). The output unit 2 in the control circuit 10 outputs the control voltage to the IGBT 21 based on the ignition signal Vs. With this, the IGBT 21 is turned on, and the collector current Ic flows (step S2). In this case, the collector current Ic is controlled to be constant as described above.

By entering into an operating state, the temperature of the IGBT 21 and the temperature of the control circuit 10 begin to rise simultaneously (step S3). While the temperature of the IGBT 21 rises because of the collector current Ic, the temperature of the control circuit 10 rises primarily because of the emitter current Ie that flows from the IGBT 21 to the current detection circuit in the output control unit 3 in the control circuit 10. In this case, the IGBT 21 generates more Joule heat compared with the control circuit 10, since a resistance of the shunt resistor, through which the emitter current Ie flows into the ground in the current detection circuit, is smaller than an ON resistance of the IGBT 21. Therefore, a rate of the rise in the temperature of the IGBT 21 is larger than that of the control circuit 10.

Figure 6A:
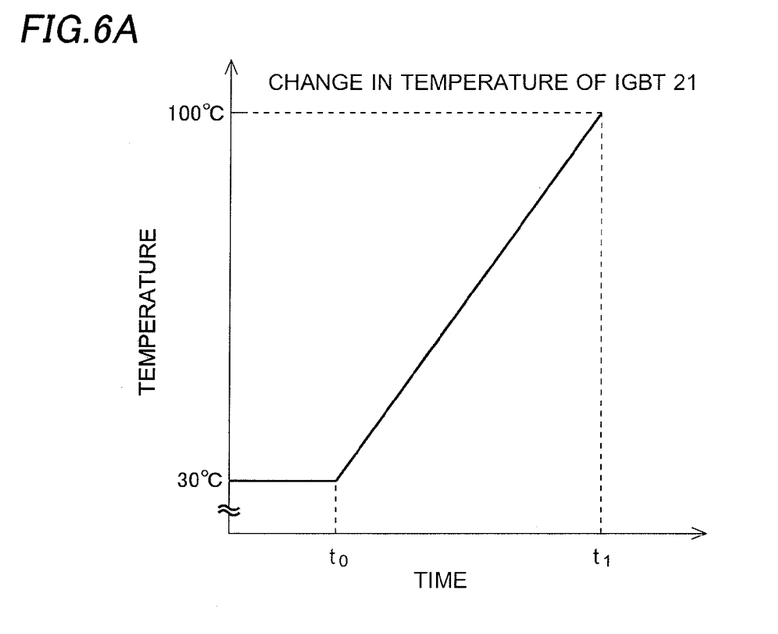
FIG. 6A shows a change in a temperature of the IGBT.
Figure 6B:
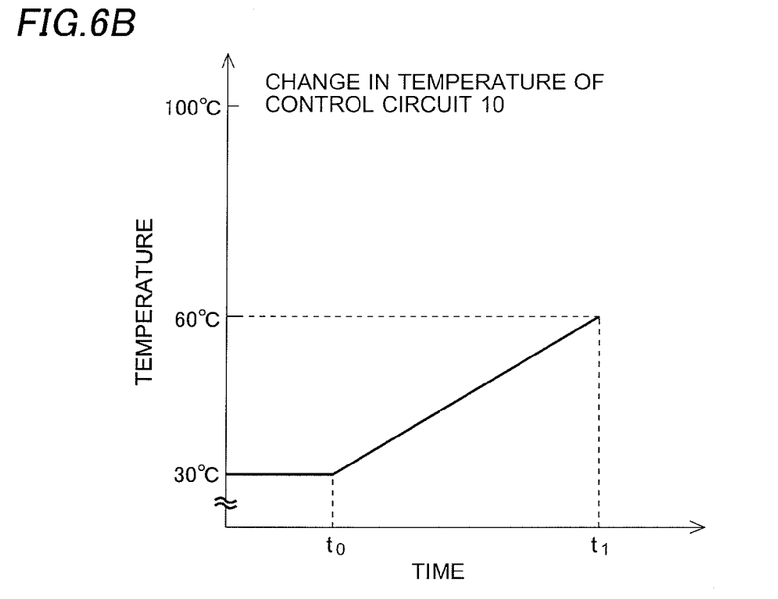
FIG. 6B shows a change in a temperature of the control circuit.

Thus, when the temperature of the IGBT 21 rises to the first preset temperature, the temperature of the control circuit 10 detected by the temperature detection unit 4 rises to a temperature lower than the first preset temperature. Suppose the IGBT 21 and the control circuit 10 are placed at 30° C. of ambient temperature before being put into operation, as shown in FIGS. 6A and 6B. After they are put into operation at the time t0, while the temperature of the IGBT 21 reaches 100° C. at a time t1 as shown in FIG. 6A, the temperature of the control circuit 10 reaches 60° C. at the time t1 as shown in FIG. 6B.

The temperature detection unit 4 detects the temperature of the control circuit 10 (step 4). In the case the temperature characteristics are as shown in FIGS. 6A and 6B, the second preset temperature is set to 60° C. The temperature detection unit 4 monitors whether the temperature of the control circuit 10 rises above the second preset temperature (60° C.) or not (step S5). When the temperature of the control circuit 10 rises higher than the second preset temperature (60° C.), the temperature detection unit 4 outputs the detection signal (step S6).

Then, the output control unit 3 executes the thermal shutdown by controlling the output unit 2 so as to turn off the IGBT 21 to cut the collector current Ic of the IGBT 21 to zero in response to the detection signal outputted from the temperature detection unit 4 when the temperature of the IGBT 21 rises to the first preset temperature (100° C.) (step S7).

With the control circuit 10, the temperature of the IGBT 21 can be estimated accurately to execute the thermal shutdown based on the detection signal from the temperature detection unit 4, which corresponds to the second preset temperature, without increasing the number of terminals as described above, since the temperature detection unit 4 is incorporated in the control circuit 10.

The control circuit 10 described above takes-in the emitter current Ie of the IGBT 21 from the input terminal P3 and passes it to the shunt resistor in the output control unit 3. Two other structures (modified examples) are conceivable to form the current path for the emitter current Ie of the IGBT 21.

Figure 16:
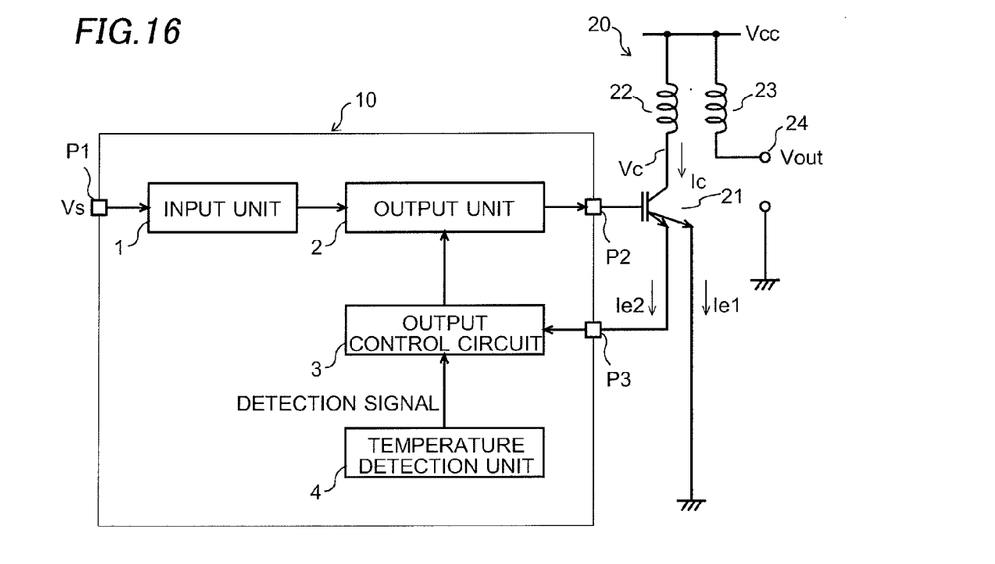
FIG. 16 is a circuit diagram showing a first modified example of the IGBT control circuit according to the first embodiment of this invention.

In one of the structures, the emitter current Ie is divided into a first emitter current Ie1 and a second emitter current Ie2, as shown in FIG. 16. In this case, the first emitter current Te1, that makes a main stream, is set to be larger than the second emitter current Ie2, that makes a tributary. The second emitter current Ie2 is taken-in from the input terminal P3 and passed to the shunt resistor in the output control unit 3. With this, the rate of the rise in the temperature of the control circuit 10 can be suppressed since the temperature of the control circuit 10 is raised by heat generation of the second emitter current Ie2 that is the tributary.

Figure 17:
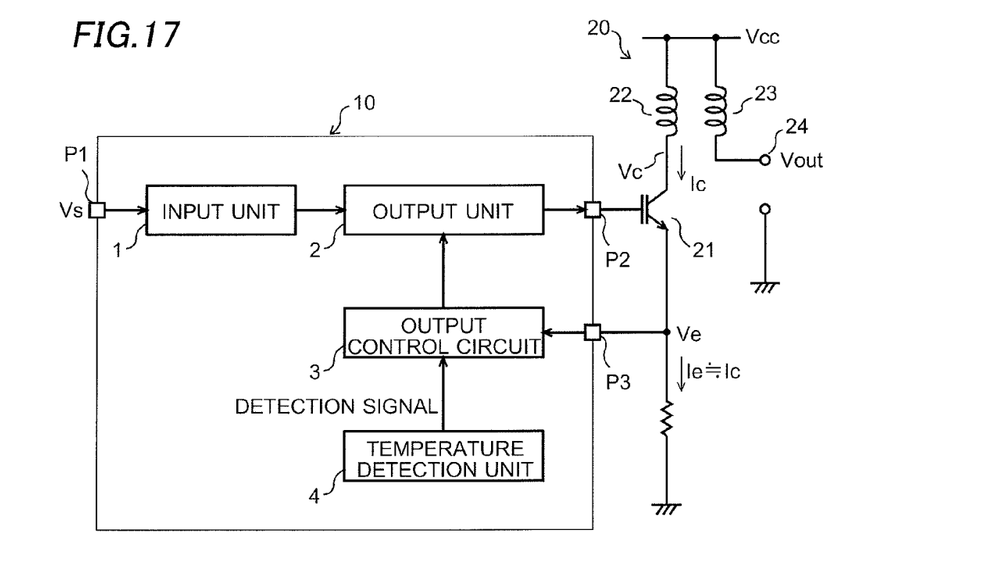
FIG. 17 is a circuit diagram showing a second modified example of the IGBT control circuit according to the first embodiment of this invention.

In another structure, the emitter current Ie of the IGBT 21 flows into the ground outside the control circuit 10 through a shunt resistor 25 that is provided outside the control circuit 10, as shown in FIG. 17. In this case, a voltage Ve (emitter voltage) at a connecting node between the emitter of the IGBT 21 and the shunt resistor 25 is taken into the output control unit 3 through the input terminal P3. Since the voltage Ve is proportional to the emitter current Ie and the collector current Ic, the current detection circuit in the output control unit 3 can detect the emitter current Ie and the collector current Ic based on the voltage Ve. The temperature of the control circuit 10 is raised by heat generated by the voltage Ve.

Second Embodiment

Figure 7:
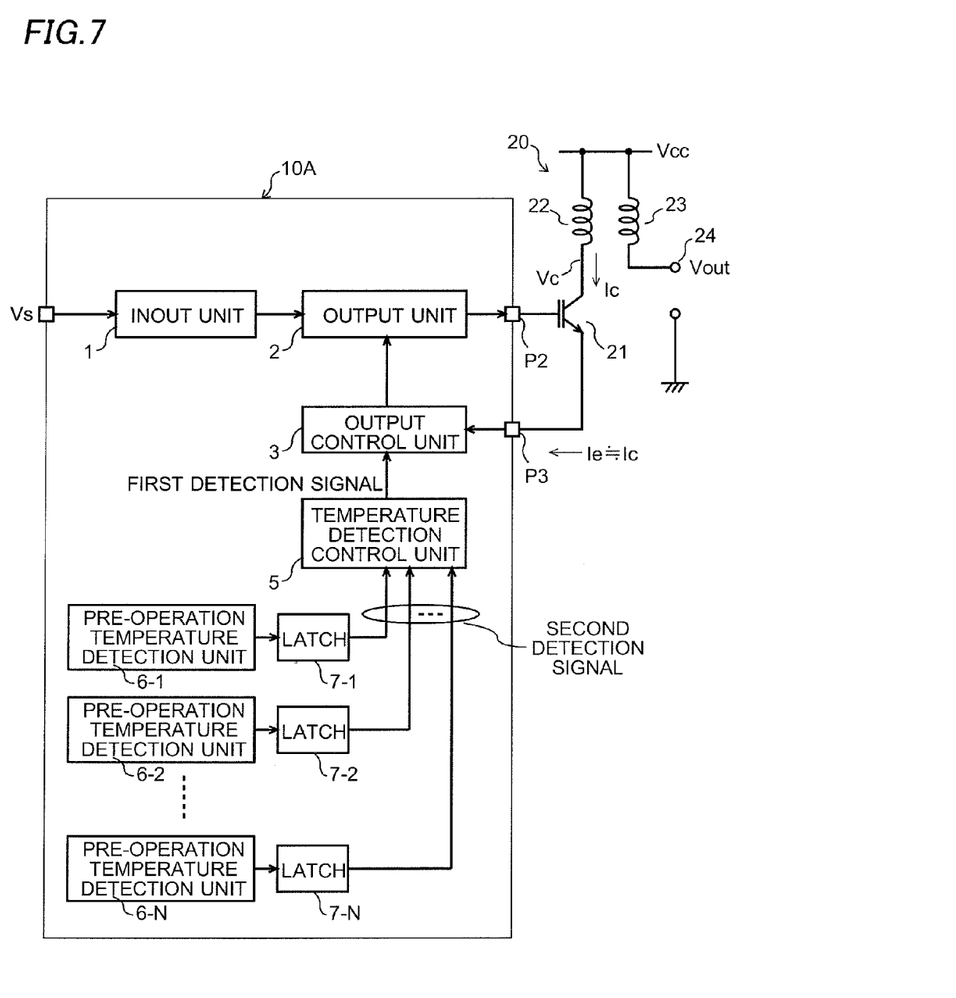
FIG. 7 is a circuit diagram showing an IGBT control circuit according to a second embodiment of this invention.

An IGBT control circuit according to a second embodiment of this invention is described referring to the drawings. FIG. 7 is a circuit diagram of the IGBT control circuit. The circuit shown in FIG. 7 as a whole makes an ignition device for an internal combustion engine, and includes an ignition coil circuit 20 to generate a high ignition voltage and a control circuit 10A to control operations of an IGBT 21 in the ignition coil circuit 20.

The control circuit 10A is formed to be an IC including an input unit 1, an output unit 2, an output control unit 3, a temperature detection control unit 5, pre-operation temperature detection units 6-1-6-N and latches 7-1-7-N. The ignition coil circuit 20 is provided outside the control circuit 10A, and is formed to include the IGBT 21, a primary coil 22, a secondary coil 23 and an output terminal 24. The ignition coil circuit 20 may be formed in another IC or an IC module that is separate from the control circuit 10A.

An ignition signal Vs is inputted to the input unit 1 through an input terminal P1 in the control circuit 10A. The output unit 2 includes an output transistor, and generates a control voltage for controlling an operating current (collector current Ic) flowing through the IGBT 21 based on the ignition signal Vs and a control signal from the output control unit 3, and outputs it from the output transistor. The control voltage is applied to a gate of the IGBT 21 through an output terminal P2.

When the IGBT 21 is put into operation based on the control voltage from the output unit 2, a temperature of the IGBT 21 and a temperature of the control circuit 10A begin to rise simultaneously. In the IGBT control circuit according to the first embodiment, the temperature detection unit 4 is configured to output the detection signal when the temperature of the control circuit 10 rises above the second preset temperature (60° C., for example) defined corresponding to the first preset temperature (100° C., for example) of the IGBT 21. That is, the second preset temperature of the control circuit 10 is fixed against the first preset temperature of the IGBT 21.

However, it is preferable that the second preset temperature is adjusted corresponding to a temperature of the control circuit 10A before beginning the operation (hereafter referred to as a pre-operation temperature). The reason is as follows. Referring to FIG. 6, the pre-operation temperature of the control circuit 10A and the pre-operation temperature of the IGBT 21 are equal to each other because they are usually placed in the same ambient temperature. In the case where the pre-operation temperature is higher than 30° C. (50° C., for example), the temperature of the control circuit 10A and the temperature of the IGBT 21 begin rising from a start point of 50° C. at the beginning of the operation. Then, the temperature of the control circuit 10A becomes higher than 60° C. when the temperature of the IGBT reaches the first preset temperature (100° C.), because the rate of the rise in the temperature of the control circuit 10A is smaller than that of the IGBT 21. Therefore, it is necessary to set the second preset temperature higher than 60° C. When the pre-operation temperature is lower than 30° C. (0° C., for example), on the other hand, it is necessary to set the second preset temperature lower than 60° C. The second preset temperatures required in such cases can be found by measurements performed in advance.

Thus, the IGBT control circuit according to the second embodiment is structured so that the second preset temperature can be adjusted based on the pre-operation temperature that is detected in advance. For that purpose, the control circuit 10A is provided with N pre-operation temperature detection units 6-1-6-N and corresponding N latches 7-1-7-N (an example of "retaining circuit" of this invention). Here, N is a natural number equal to or larger than one.

Each of the pre-operation temperature detection units 6-1-6-N has corresponding each of first through N-th threshold temperatures T1-TN, and outputs a detection signal to corresponding each of the latches 7-1-7-N when it detects whether the temperature of the control circuit 10A is higher than the corresponding each of the first through N-th threshold temperatures T1-TN or not, so that a second detection signal is stored in the latches 7-1-7-N. Each of the pre-operation temperature detection units 6-1-6-N can be made of the circuit shown in FIG. 2 or the circuit shown in FIG. 3. In this case, the reference voltage Vref of the circuit shown in FIG. 2 and the ratio R2/R1 of the circuit shown in FIG. 3 are determined corresponding to each of the first through N-th threshold temperatures T1-TN.

The latches 7-1-7-N retain the second detection signal outputted from the pre-operation temperature detection units 6-1-6-N. The temperature detection control unit 5 outputs a first detection signal when the temperature of the control circuit 10A rises above the second preset temperature defined corresponding to the first preset temperature of the IGBT 21. In this case, the temperature detection control unit 5 is configured so that the second preset temperature can be modified in accordance with the second detection signal retained in the latches 7-1-7-N.

Figure 8:
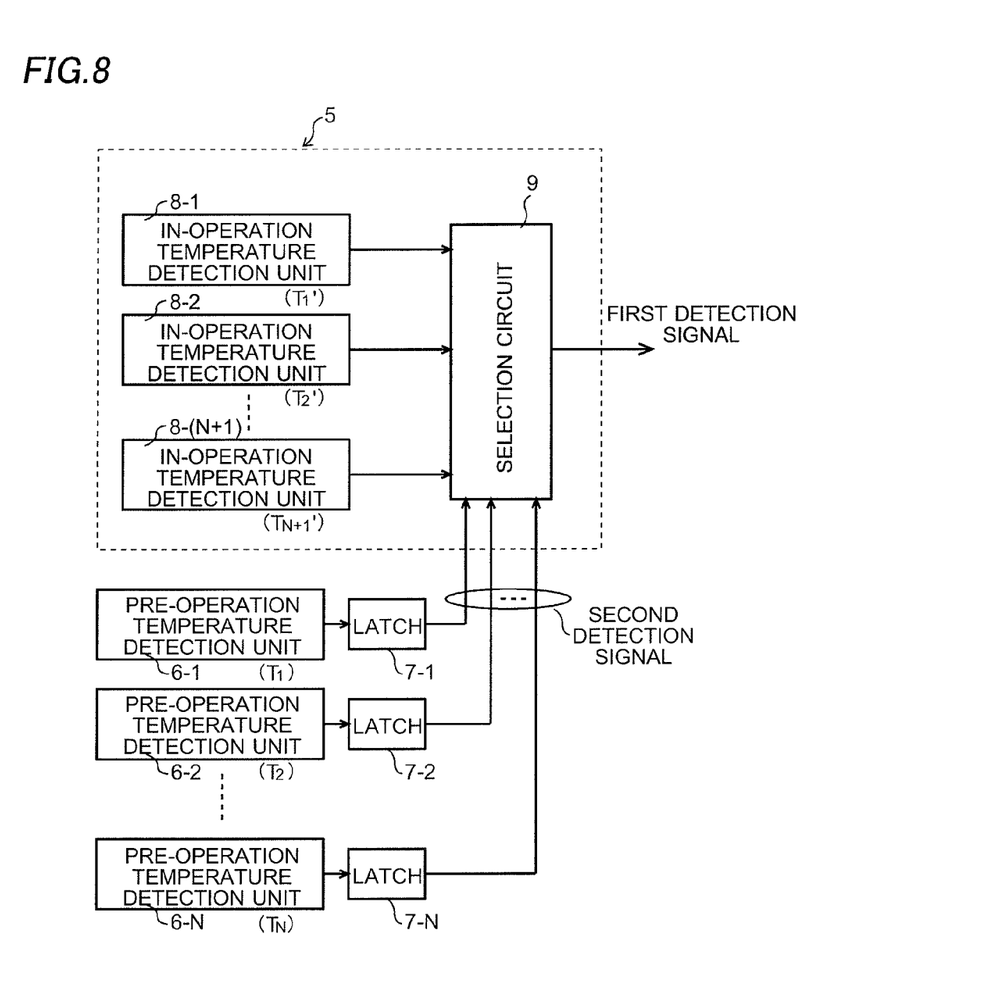
FIG. 8 shows a structure of a temperature detection control unit in the IGBT control circuit according to the second embodiment of this invention.

To be more specific, the temperature detection control unit 5 is structured to include N+1 in-operation temperature detection units 8-1-8-(N+1) and a selection circuit 9 to select an in-operation temperature detection unit 8-$j$ ($j=1, 2, 3 \ldots$ or N+1) out of the N+1 in-operation temperature detection units 8-1-8-(N+1) in accordance with the second detection signal retained in the latches 7-1-7-N, as shown in FIG. 8.

Figure 9:
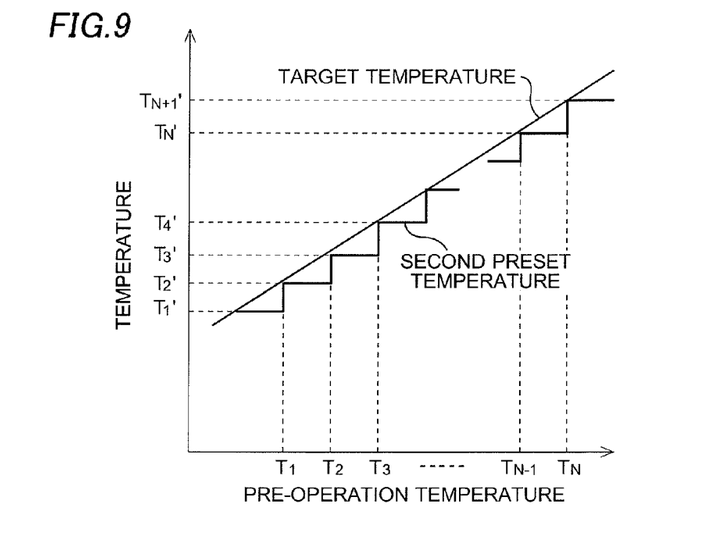
FIG. 9 shows correlations between either of a second preset temperature and a target temperature and a pre-operation temperature.

Each of the in-operation temperature detection units 8-1-8-(N+1) has each of first through N+1 threshold temperatures T1'-TN+1', respectively, and is made of a circuit similar to each of the pre-operation temperature detection units 6-1-6-N. FIG. 9 shows correlations between either of the second preset temperature and a target temperature and the pre-operation temperature. The target temperature is the temperature of the control circuit 10A at the time when the IGBT 21 reaches the first preset temperature. It is preferable that the second preset temperature of the control circuit 10A is set to be equal to or as close as possible to the target temperature.

When the pre-operation temperature is within a temperature range between T1 and T2, for example, the detection signal from the pre-operation temperature detection unit 6-1 is at a first level (low level, for example) and the other detection signals from the rest of the pre-operation temperature detection units 6-2-6-N are at a second level (high level, for example).

Then, the selection circuit 9 selects the in-operation temperature detection unit 8-2 in accordance with the second detection signal composed of the detection signals described above. As a result, the second preset temperature is set to T2' when the pre-operation temperature is within the temperature range between T1 and T2.

Similarly, when the pre-operation temperature is within a temperature range between T2 and T3, the detection signals from the pre-operation temperature detection units 6-1 and 6-2 are at the first level (low level, for example) and the other detection signals from the rest of the pre-operation temperature detection units 6-3-6-N are at the second level (high level, for example).

Then, the selection circuit 9 selects the in-operation temperature detection unit 8-3 in accordance with the second detection signal composed of the detection signals described above. As a result, the second preset temperature is set to T3' when the pre-operation temperature is within the temperature range between T2 and T3. The same applies when the pre-operation temperature is within other temperature ranges.

Figure 10:
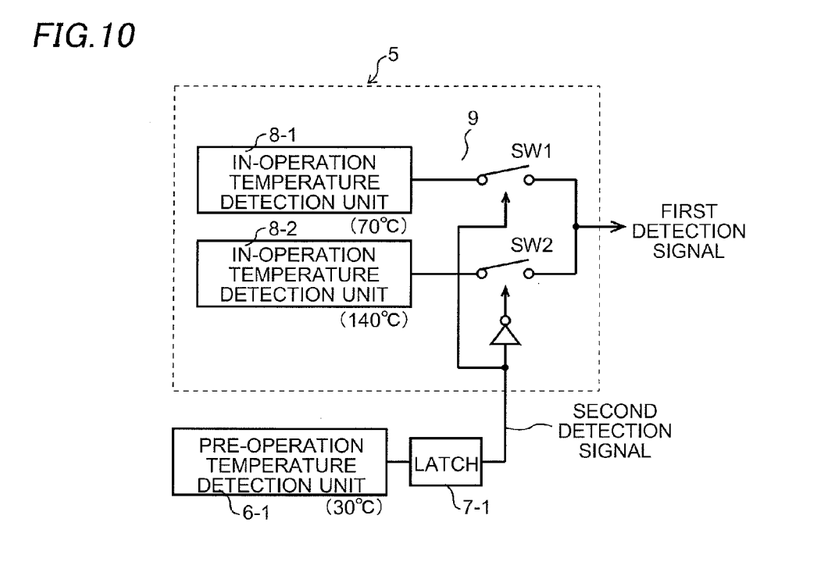
FIG. 10 is a circuit diagram showing a first concrete structure example of the temperature detection control unit in the IGBT control circuit according to the second embodiment of this invention.

FIG. 10 is a circuit diagram showing a first example of a concrete structure of the temperature detection control unit 5. In this case, there are provided one pre-operation temperature detection unit 6-1 and two in-operation temperature detection units 8-1 and 8-2. The selection circuit 9 is made of switches SW1 and SW2. The pre-operation temperature detection unit 6-1 has the threshold temperature of 30° C. The in-operation temperature detection unit 8-1 has the threshold temperature of 70° C., and the in-operation temperature detection unit 8-2 has the threshold temperature of 140° C.

In the case where the pre-operation temperature is lower than 30° C., the switch SW1 is turned on and the switch SW2 is turned off in accordance with the second detection signal from the pre-operation temperature detection unit 6-1, and the in-operation temperature detection unit 8-1 is selected. With this, the first detection signal is obtained from the in-operation temperature detection unit 8-1 and the second preset temperature is set to be 70° C.

In the case where the pre-operation temperature is higher than 30° C., the switch SW1 is turned off and the switch SW2 is turned on in accordance with the second detection signal from the pre-operation temperature detection unit 6-1, and the in-operation temperature detection unit 8-2 is selected. With this, the first detection signal is obtained from the in-operation temperature detection unit 8-2 and the second preset temperature is set to be 140° C.

Figure 11:
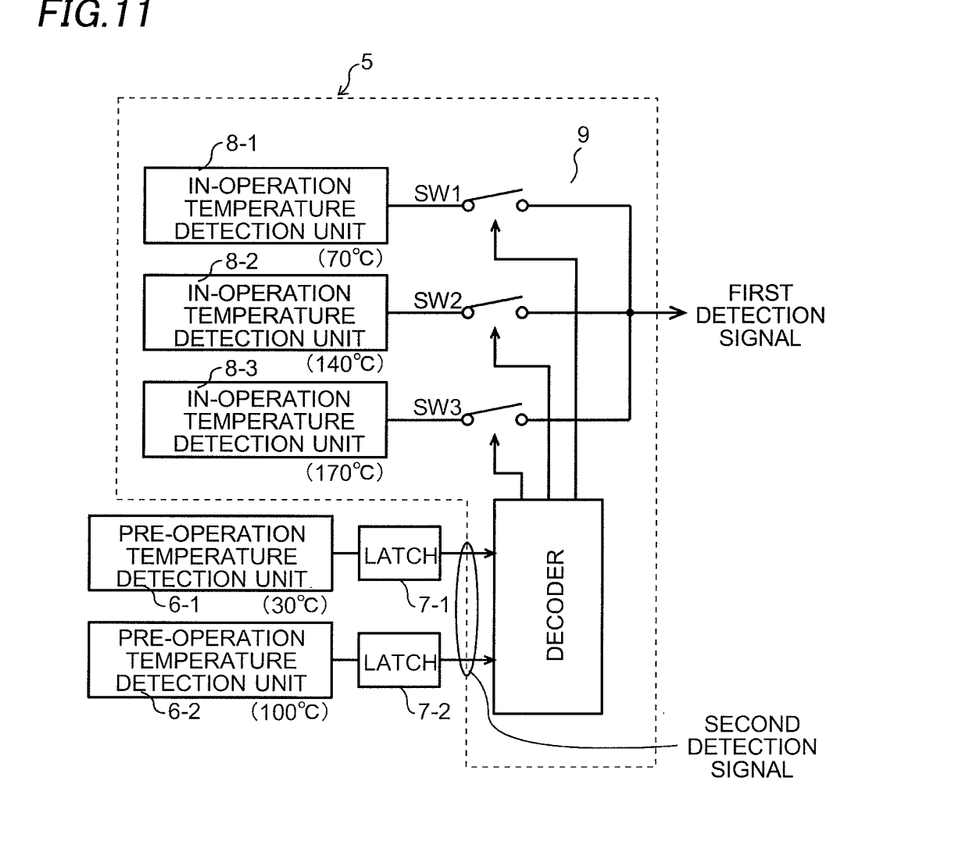
FIG. 11 is a circuit diagram showing a second concrete structure example of the temperature detection control unit in the IGBT control circuit according to the second embodiment of this invention.

FIG. 11 is a circuit diagram showing a second example of the concrete structure of the temperature detection control unit 5. In this case, there are provided two pre-operation temperature detection units 6-1 and 6-2 and three in-operation temperature detection units 8-1, 8-2 and 8-3. The selection circuit 9 is made of switches SW1, SW2 and SW3 and a decoder that decodes the second detection signal from the pre-operation temperature detection units 6-1 and 6-2.

The pre-operation temperature detection unit 6-1 has the threshold temperature of 30° C., and the pre-operation temperature detection unit 6-2 has the threshold temperature of 100° C. The in-operation temperature detection unit 8-1 has the threshold temperature of 70° C., the in-operation temperature detection unit 8-2 has the threshold temperature of 140° C., and the in-operation temperature detection unit 8-3 has the threshold temperature of 170° C. In this case, the first preset temperature of the IGBT 21 is 170° C., for example.

Figure 12:
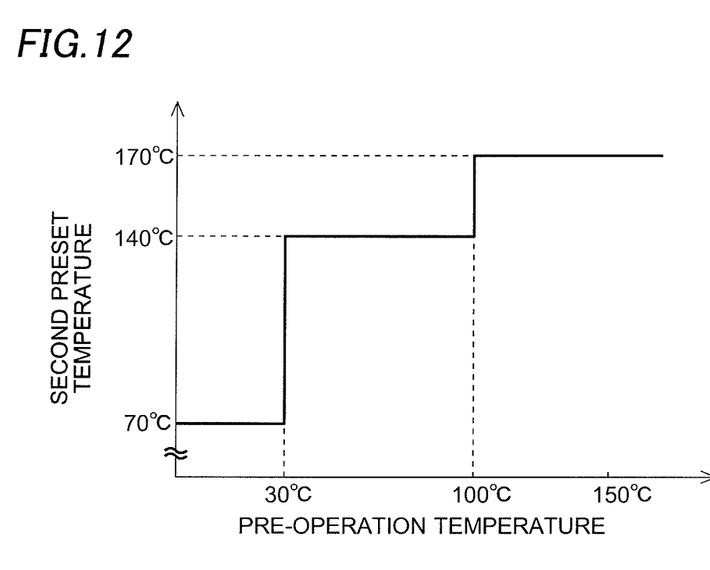
FIG. 12 shows a correlation between the second preset temperature and the pre-operation temperature.

Then, the correlation between the second preset temperature and the pre-operation temperature becomes as shown in FIG. 12. That is, in the case where the pre-operation temperature is lower than 30° C., the switch SW1 is turned on and the switches SW2 and SW3 are turned off in accordance with a result of decoding of the second detection signal from the pre-operation temperature detection units 6-1 and 6-2, and the in-operation temperature detection unit 8-1 is selected. With this, the first detection signal is obtained from the in-operation temperature detection unit 8-1 and the second preset temperature is set to be 70° C.

In the case where the pre-operation temperature is higher than 30° C. and lower than 100° C., the switch SW2 is turned on and the switches SW1 and SW3 are turned off in accordance with the result of decoding of the second detection signal from the pre-operation temperature detection units 6-1 and 6-2, and the in-operation temperature detection unit 8-2 is selected. With this, the first detection signal is obtained from the in-operation temperature detection unit 8-2 and the second preset temperature is set to be 140° C.

In the case where the pre-operation temperature is higher than 100° C., the switch SW3 is turned on and the switches SW1 and SW2 are turned off in accordance with the result of decoding of the second detection signal from the pre-operation temperature detection units 6-1 and 6-2, and the in-operation temperature detection unit 8-3 is selected. With this, the first detection signal is obtained from the in-operation temperature detection unit 8-3 and the second preset temperature is set to be 170° C.

=Thermal Shutdown Operation=

Figure 13:
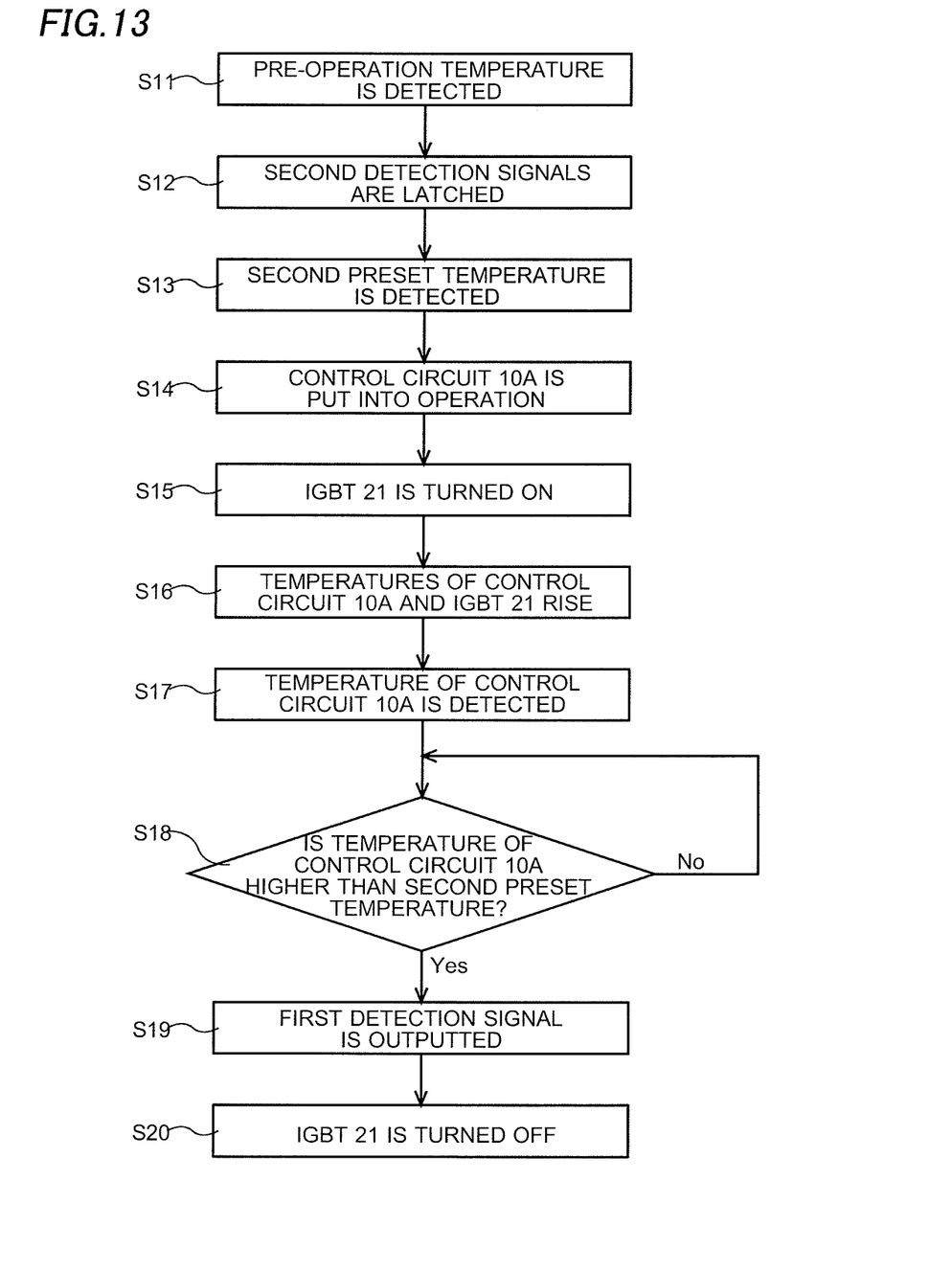
FIG. 13 is a flowchart showing operations of the IGBT control circuit according to the second embodiment of this invention.

Next, the thermal shutdown operation of the control circuit 10A structured as described above will be explained referring to a flowchart shown in FIG. 13.

First, the pre-operation temperature of the control circuit 10A is detected by the pre-operation temperature detection units 6-1-6-N (step S11). The results of detections by the pre-operation temperature detection units 6-1-6-N are retained by the latches 7-1-7-N as the second detection signal (step S12). The temperature detection control unit 5 determines the second preset temperature based on the first preset temperature (175° C., for example) of the IGBT 21 and the second detection signal (step S13).

Next, when the ignition signal Vs is inputted to the input terminal P1 in the control circuit 10A, the control circuit 10A is turned to an ON state (enable state) and is put into operation (step S14). The output unit 2 in the control circuit 10A outputs the control voltage to the IGBT 21 based on the ignition signal Vs. With this, the IGBT 21 is turned on, and the collector current Ic flows (step S15). In this case, the collector current Ic is controlled to be constant as described above.

By entering into an operating state, the temperature of the IGBT 21 and the temperature of the control circuit 10A begin to rise simultaneously (step S16). The temperature detection control unit 5 detects the temperature of the control circuit 10A based on the second preset temperature determined in the step S13. That is, the temperature detection unit 5 monitors whether the temperature of the control circuit 10A rises above the second preset temperature or not (step S17). When the temperature of the control circuit 10A becomes higher than the second preset temperature, the temperature detection control unit 5 outputs the first detection signal (step S19).

The output control unit 3 executes the thermal shutdown by controlling the output unit 2 so as to turn off the IGBT 21 to cut the collector current Ic of the IGBT 21 to zero in response to the first detection signal outputted from the temperature detection control unit 5 when the temperature of the IGBT 21 rises to the first preset temperature that is targeted (step S20).

With the control circuit 10A, the temperature of the IGBT 21 is estimated more accurately to execute the thermal shutdown, since the second preset temperature can be modified appropriately in accordance with the pre-operation temperature.

The structures shown in FIG. 16 and FIG. 17 can be adopted to divide the emitter current Ie of the IGBT 21 in the IGBT control circuit according to the second embodiment as in the IGBT control circuit according to the first embodiment.

In the first and second embodiments, the thermal shutdown is executed on the IGBT 21 incorporated in the ignition device of the internal combustion engine. This invention is not limited to be applied to the thermal shutdown of the IGBT 21 that is an example of the switching device which generates heat by the operating current, but also can be applied to the thermal shutdown of other switching devices (a bipolar transistor, a MOS transistor and the like, for example).

With the switching device control circuit according to each of the embodiments of this invention, the temperature of the power device can be accurately estimated to execute the thermal shutdown without increasing the number of terminals.

What is claimed is:

1. A control circuit of a switching device comprising:
an output unit controlling an operating current flowing through the switching device based on an input signal;
a pre-operation temperature detection unit detecting a temperature of the control circuit before the switching device is put into operation;
a temperature detection control unit outputting a first detection signal when the temperature of the control circuit rises above a second preset temperature after the switching device is put into operation and being configured to be capable of modifying the second preset temperature in accordance with a result of detection performed by the pre-operation temperature detection unit, the second preset temperature being defined corresponding to a first preset temperature of the switching device; and an output control unit controlling the output unit so as to turn off the switching device in response to the first detection signal.

2. The control circuit of the switching device of claim 1, wherein the pre-operation temperature detection unit is configured to detect whether the temperature of the control circuit before the switching device is put into operation is higher than a first threshold temperature or not and to output a second detection signal accordingly, and the temperature detection control unit is configured to output the first detection signal in accordance with the second detection signal.

3. The control circuit of the switching device of claim 2, further comprising a retaining circuit retaining the second detection signal, wherein the temperature detection control unit outputs the first detection signal in accordance with the second detection signal retained in the retaining circuit.

4. The control circuit of the switching device of claim 2, wherein the temperature detection control unit comprises a first in-operation temperature detection unit detecting whether the temperature of the control circuit is higher than a second threshold temperature or not, a second in-operation temperature detection unit detecting whether the temperature of the control circuit is higher than a third threshold temperature or not, and a selection circuit selecting either the first in-operation temperature detection unit or the second in-operation detection unit in accordance with the second detection signal.

5. The control circuit of the switching device of claim 1, wherein the output control unit is configured to detect the operating current flowing through the switching device and perform a feedback control on the output unit so as to make the operating current constant.

6. The control circuit of the switching device of claim 1, wherein the second preset temperature is lower than the first preset temperature.

7. The control circuit of the switching device of claim 1, wherein the switching device is an insulated gate bipolar transistor, and the output unit outputs a control voltage to a gate of the insulated gate bipolar transistor.

* * * * *